United States Patent [19]

Shimizu et al.

[11] Patent Number: 5,389,816
[45] Date of Patent: Feb. 14, 1995

[54] MULTI-LAYER LEAD FRAME USING A METAL-CORE SUBSTRATE

[75] Inventors: Mitsuharu Shimizu; Masato Tanaka, both of Nagano, Japan

[73] Assignee: Shinko Electric Industries Co., Ltd., Nagano, Japan

[21] Appl. No.: 139,737

[22] Filed: Oct. 22, 1993

[30] Foreign Application Priority Data

Nov. 19, 1992 [JP] Japan .................................. 4-333679

[51] Int. Cl.$^6$ ...................... H01L 23/48; H01L 29/44; H01L 29/52; H01L 29/60
[52] U.S. Cl. ................................... 257/666; 257/691; 257/672; 257/676
[58] Field of Search ................ 257/691, 666, 668, 672, 257/674, 676

[56] References Cited

U.S. PATENT DOCUMENTS

| | | | |
|---|---|---|---|
| 4,891,687 | 1/1990 | Mallik et al. | 257/676 |
| 5,089,878 | 2/1992 | Lee | 257/666 |
| 5,196,725 | 3/1993 | Mita et al. | 257/666 |
| 5,214,845 | 6/1993 | King et al. | 257/668 |
| 5,220,195 | 6/1993 | McShane et al. | 257/666 |
| 5,237,202 | 8/1993 | Shimizu et al. | 257/672 |

FOREIGN PATENT DOCUMENTS 2-58361  2/1990  Japan .

OTHER PUBLICATIONS

Patent Abstracts of Japan, vol. 017, No. 375 (E-1397) 14 Jul. 1993 & JP-A-05 063 130 (Sumitomo Special Metals Co Ltd) 12 Mar. 1993.
Patent Abstracts of Japan, vol. 016, No. 200 (E-1201) 13 May 1992 & JP-A-04 030 541 (Shinko Electric Ind Co Ltd) 3 Feb. 1992.
Patent Abstracts of Japan, vol. 015, No. 326 (E-1102) 20 Aug. 1991 & JP-A-03 123 067 (Shinko Electric Ind Co Ltd) 24 May 1991.
Patent Abstracts of Japan, vol. 016, No. 513 (E-1283) 22 Oct. 1992 & JP-A-04 192 452 (Sumitomo Metal Mining Co Ltd) 10 Jul. 1992.

Primary Examiner—Andrew J. James
Assistant Examiner—S. V. Clark
Attorney, Agent, or Firm—Staas & Halsey

[57] ABSTRACT

A metal-core-type multi-layer lead frame adapted to be used for a semiconductor device includes a metal core plate on which a semiconductor chip is to be mounted. A plurality of signal lines are formed on the metal core plate. A metal plane, such as a power supply plane or a ground plane, is laminated on the signal lines, through an insulating layer, so that an outer peripheral edge of said metal core plate is uncovered to expose the outer portion of the respective signal lines. A lead frame body has a plurality of leads which are electrically connected to the respective signal lines at the outer peripheral edge of the metal core plate.

13 Claims, 3 Drawing Sheets

MULTI-LAYER LEAD FRAME USING A METAL-CORE SUBSTRATE

BACKGROUND OF THE INVENTION

1. Field of the Invention

This invention relates to a lead frame and particularly to a metal-core-type multi-layer lead frame, having at least one metal core plate hereinafter referred to as a core plate, which is used for a semiconductor device.

2. Description of the Related Art

A metal-core-type multi-layer lead frame is a product which is capable of mounting thereon a highly sophisticated semiconductor chip and capable of being applied to a multi-tip system. Using such a multi-layer lead frame including therein a metal core, thermal radiation from the highly integrated semiconductor chip and electrical characteristics can be improved and the number of pins available can be increased through a plurality of layers of the wiring patterns.

FIGS. 5(a) and 5(b) show a conventionally known metal-core-type multi-layer lead frame, in which metal cores are formed as a plurality of conductive layers. As shown in FIG. 5(a), the metal cores 5 are composed of a signal layer 7, a power supply layer 8 and a ground layer 9 laminated to each other by means of electrically insulated layers 6 arranged therebetween. A lead frame 10 is electrically connected to the signal layer 7, the power supply layer 8 and the ground layer 9, respectively, at the outer edge portion of the metal core 5.

In the above-mentioned prior art, since the signal layer 7 is the uppermost layer, in order to connect the lead frame 10 to the signal layer 7, a signal line 7a having a predetermined pattern is formed on the metal core 5, the signal line 7a is connected to the lead frame 10, as shown in FIG. 5(a), and the semiconductor chip 12 is connected to the single lines 7a, by a wire-bonding process, to electrically connect the semiconductor chip 12 to the lead frame 10.

On the other hand, in order to connect the inner, power supply layer 8 and ground layer 9 to the lead frame 10, as shown in FIG. 5(b), the metal core 5 is provided with via holes extending in the direction of the thickness thereof, and connecting portions 14 are formed on the upper surface of the metal core 5 to electrically connect with the power supply layer 8 and the ground layer 9 by a through-hole plating or the like. Also, bonding areas 8a and 9a which are electrically connected to the power supply layer 8 and the ground layer 9, respectively, are provided in the vicinity of the semiconductor chip 12. Thus, the lead frame 10 is connected to the connecting portions 14 and the bonding areas 8a and 9a and the semiconductor chip 12 are connected to the power supply layer 8 and the ground layer 9 by wire-bonding.

However, in the prior art as mentioned above, the metal core 5 must be provided with via holes so as to electrically connect the metal core 5 to the required conductive layers. It is difficult to form such via holes at accurate positions on the metal core 5 and also it is troublesome to form a structure such that the conductive layers of the metal core 5 are electrically connected to the lead frame.

In case of forming the via holes on the metal core 5, such holes are formed by machining with a drill or the like. However, there is a lower limitation of about 300 $\mu$m in the diameter of such via holes. Therefore, it is almost impossible to form a very fine pattern, such as having leads pitched at about 150 $\mu$m or less.

Thus, the conventional metal-core-type multi-layer lead frame has such problems that the manufacturing process thereof is relatively complicated, the cost for producing the same is relatively high, and the forming of very fine patterns is difficult.

SUMMARY OF THE INVENTION

Accordingly, an object of the present invention is to provide a metal-core-type multi-layer lead frame adapted to be used for a semiconductor device, in which the manufacturing process thereof can be simplified, fine patterns can easily be formed, and the cost for producing the same can be reduced.

Another object of the present invention is to provide a metal-core-type multi-layer lead frame, in which the electrical characteristics can be improved.

According to this invention, there is provided a metal-core-type multi-layer lead frame adapted to be used for a semiconductor device comprising: a metal core plate on which a semiconductor chip is to be mounted; a plurality of signal lines formed on said metal core plate; a metal plane, such as a power supply plane or a ground plane, laminated on said signal lines through an insulation layer so that at least an outer peripheral edge of said metal core plate is uncovered to expose at least a portion of said respective signal lines; and a lead frame body having a plurality of leads which are electrically connected to said signal lines at said outer peripheral edge of said metal core plate.

According to another aspect of the present invention, there is provided a metal-core-type multi-layer lead frame adapted to be used for a semiconductor device comprising: a metal core plate having a central die-bonding area on which a semiconductor chip is to be mounted, a wire bonding area around said die-bonding area and an outer peripheral edge; a plurality of signal lines formed on said metal core plate, each of said signal lines extending from said outer peripheral edge to said wire-bonding area on said metal core plate; a first metal plane, such as a power supply plane, laminated on said signal lines through a first insulation layer so that at least said die-bonding area, said wire bonding area and said outer peripheral edge of said metal core plate are not covered by said first metal plane to expose an outer and an inner portion of said respective signal line; a second metal plane, such as a ground plane, laminated on said first metal plane through a second insulation layer, so that at least an inner peripheral edge of said first metal plane is uncovered by said second metal plane to expose at least an inner periphery of said first metal plane; and a lead frame body having a plurality of leads which are electrically connected to said signal lines at said outer peripheral edge of said metal core plate.

DESCRIPTION OF THE PREFERRED EMBODIMENTS

Figure 1:
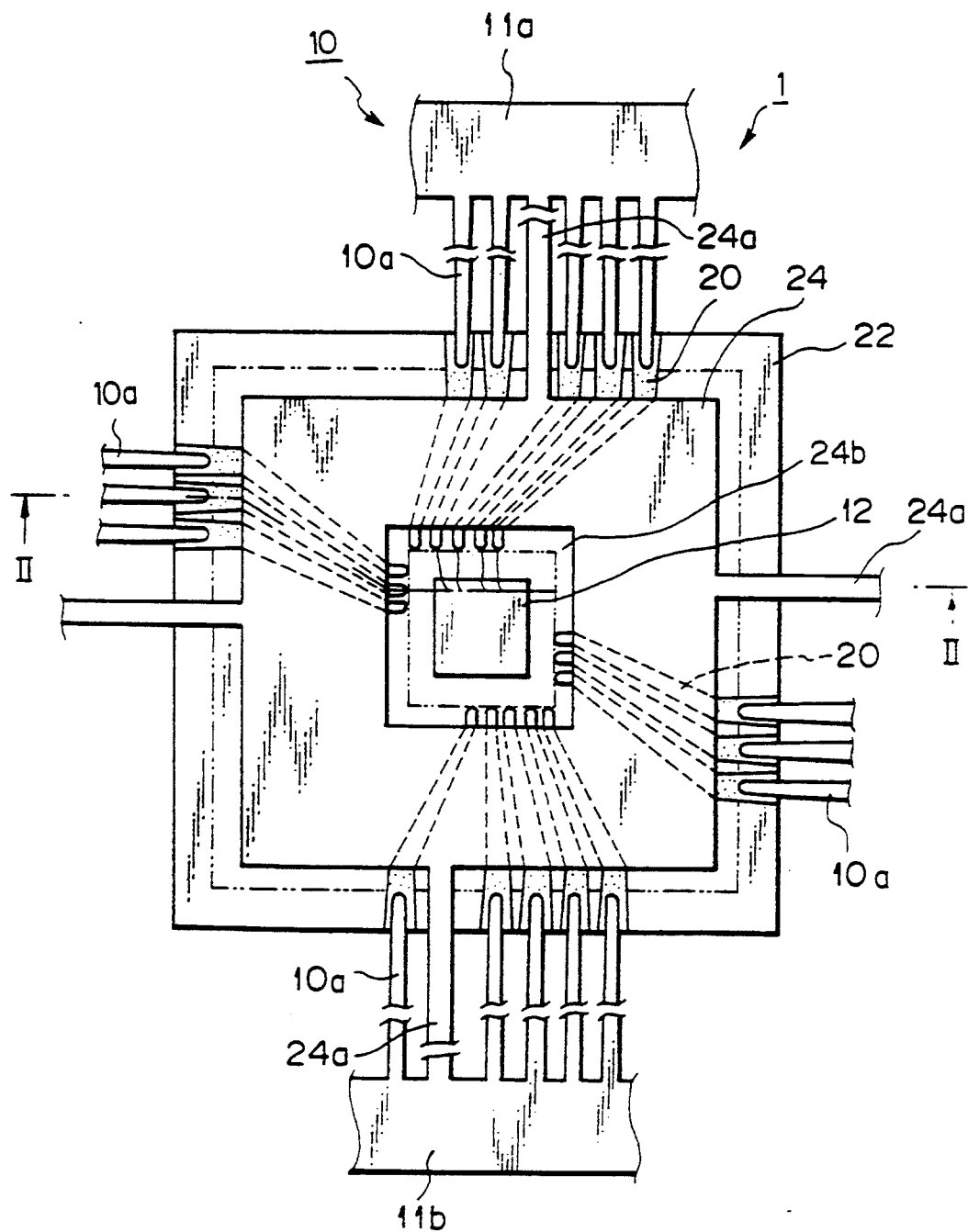
FIG. 1 is a plan view of a preferred embodiment of a metal-core-type multi-layer lead frame according to the present invention.
Figure 2:
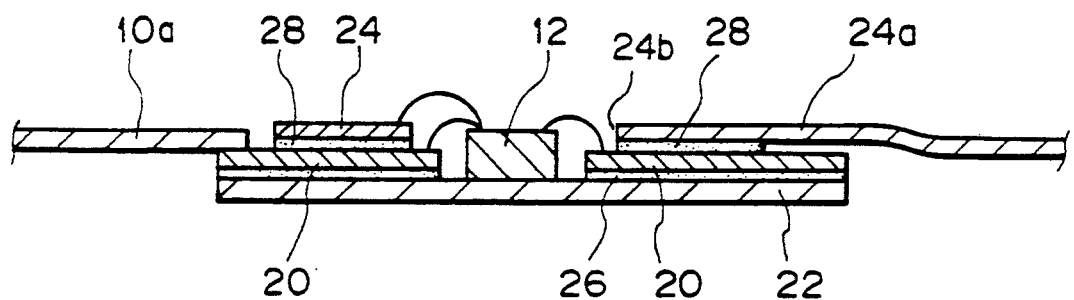
FIG. 2 is a cross-sectional view of the embodiment of the metal-core-type multi-layer lead frame taken along line II—II in FIG. 1.

FIGS. 1 and 2 show a first preferred embodiment of a metal-core-type multi-layer lead frame, according to the present invention which is adapted to be used in a semiconductor device. A metal-core-type multi-layer lead frame of this embodiment generally indicated by a reference numeral 1 comprises a bottom, metal core plate 22 having a substantially square shape and a thickness of about 0.5 to 0.25 mm.

A plurality of signal lines 20 are formed on the upper surface of the metal core plate 22. Each of these signal lines 20 extends from the peripheral edge toward the wire-bonding area in the central portion of the metal core plate 22. Such signal lines 20 can be formed by first forming a copper foil on the metal core plate 22 through an insulation layer 26 (FIG. 2) and then etching the copper foil as is known in this art. 10 A power supply plane 24 which is formed independently from the metal core plate 22 is layered on the metal core plate 22 through an electrically insulated layer 28 (FIG. 2). The power supply plane 24 has a substantially square shape, smaller than the metal core plate 22, and has a central opening 24b which is also substantially square in shape. Thus, as shown in FIG. 1, each of the signal lines 20 has an outer end at the outside of the power supply plane 24 and an inner end at the inside of the central opening 24b of the power supply plane 24. The central opening 24b makes it possible to mount a semiconductor chip 12 on the central die-bonding area of the metal core plate 22.

A lead frame body 10 having a plurality of leads 10a extends inward from the upper and lower rails 11a and 11b and from the side frames (not shown). The inner ends of the leads 10a of the lead frame are electrically connected to the outer ends of the signal lines 20 at the outer peripheral edge of the metal core plate 22. On the other hand, the inner ends of the signal lines 20 which are located within the central opening 24b are electrically connected to the semiconductor chip 12 by means of bonding-wires, as shown in FIG. 2.

In the multi-layer lead frame of this embodiment, as shown in FIG. 1, the power supply plane 24 is integral with the lead frame body 10, in such a manner that power leads 24a are extended from the outer periphery of the power supply plane 24 and connected to the upper and lower rails 11a and 11b and from the side frames (not shown) in the same manner as the plurality of leads 10a. The power supply plane 24 is also electrically connected to the semiconductor chip 12 by bonding-wires, as shown in FIG. 2. Since the power supply plane 24 is a layer different from the signal lines 20, the power supply plane 24 can be electrically connected to the semiconductor chip 12 at desired positions on the latter.

A process for making the metal-core-type multi-layer lead frame of this embodiment is as follows. First, a prescribed pattern of the signal lines 20 is formed on the metal core plate 22 through a thin electrically insulated layer 26. Then, on the pattern of signal lines 20 is formed another electrically insulated layer 28 to which the power supply plane 24 is adhered. Such a process makes it possible to simplify the manufacturing steps as compared with the above-mentioned prior art in which the metal core is provided with via holes to electrically connect the layers therebetween.

In addition, since the multi-layer lead frame according to this embodiment has no via holes, there are no restrictions in the precision where such via holes must be arranged. Therefore, the pattern of signal lines 20 which should be formed on the metal core plate 22 can be arranged precisely at high density. Also, since there are no such via holes, the self inductance, which would occur around the via holes, can be significantly reduced.

Although the embodiment of multi-layer lead frame shown in FIG. 2 is two-layer structure, in which there are the signal line layer 20 and the power supply plane 24, it is also possible to provide a ground plane in place of the power supply plane 24.

Figure 3:
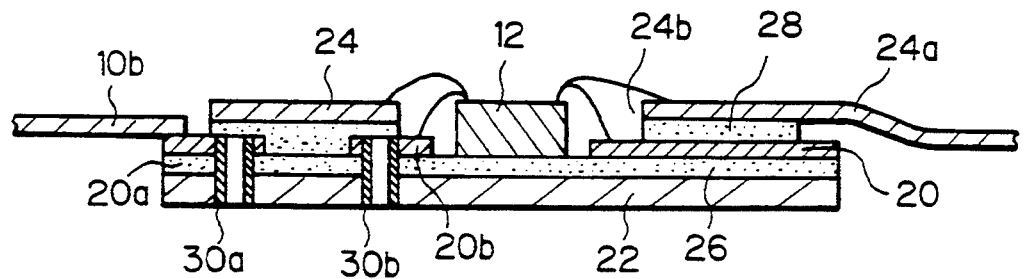
FIG. 3 is a cross-sectional view of another embodiment of the metal-core-type multi-layer lead frame similar to FIG. 2.

FIG. 3 shows another embodiment of a metal-core type multi-layer lead frame according to the present invention, in which the basic structure is the same as the embodiment shown in FIG. 2. However, in the embodiment shown in FIG. 3, the metal core plate 22 is used as a ground layer.

As shown in FIG. 3, at least one of the leads (i.e., the ground lead 10b) is connected to at least one of the lines (i.e., a ground line 20a), which is electrically connected to the metal core plate 22 by means of a plated through hole 30a. The metal core plate 22 is also electrically connected by means of another plated through hole 30b to another ground line 20b, which is, in turn, electrically connected to the semiconductor chip 12 by means of a bonded wire.

Such through holes 30a and 30b can be formed by mechanically drilling the line pattern (20), the insulating layer (26) and the metal core plate (22), when a line pattern 20 is formed by etching the copper foil on the metal core plate 22. The through holes 30a and 30b are plated with a conductive material, such as copper or the like, by an electroless-plating or the like.

Figure 4:
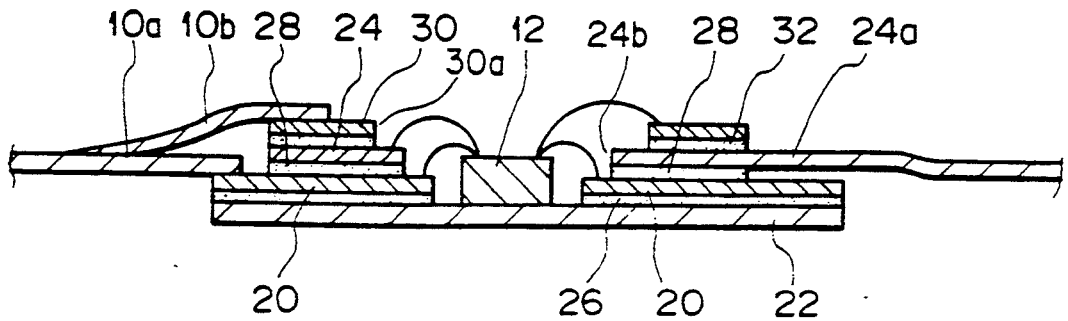
FIG. 4 is a cross-sectional view of still another embodiment of the metal-core-type multi-layer lead frame according to the present invention.
Figure 5A:
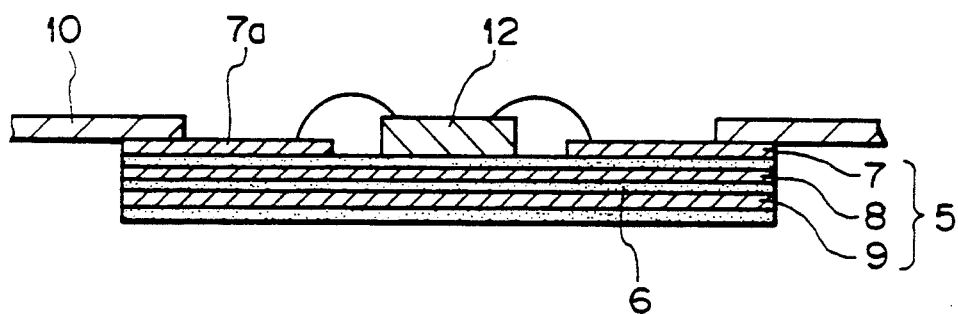
FIGS. 5(a) and 5(b) are cross-sectional views of a metal-core-type multi-layer lead frame known in the prior art.
Figure 5B:
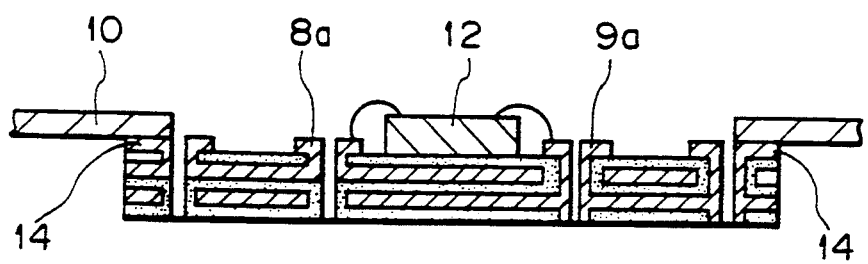

FIG. 4 shows still another embodiment of a metal-core-type multi-layer lead frame according to the present invention, in which a ground plane 30 is further provided in addition to the power supply plane 24 and is layered onto the power supply plane 24 through an electrically insulated film 32. Such a ground plane 30 is substantially rectangular in shape and has a substantially rectangular opening 30a, which is slightly larger than the opening 24b of the power supply plane 24, so that the inner peripheral area of the power supply plane 24 exposes a wire-bonding area. Thus, a multi-layer lead frame having a three-layer structure, including signal layer, power supply layer and ground layer, can be obtained.

In the same manner as the embodiment shown in FIG. 2, one or some of the leads 10b of the lead frame 10, i.e., ground leads, are extended inwardly more than the signal leads 10a, so that the inner ends of the leads 10b are electrically connected to the ground plane 30.

In the three-layer structure as shown in FIG. 4, the power supply plane 28 can also be made integral with the lead frame body 10, in the same manner as the embodiment shown in FIG. 2. In any case, such a three-layer metal-core-type lead frame can also be made easily by simply laminating a plurality of planes, i.e., the power supply and ground planes, on the base metal core.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

We claim:

1. A metal-core-type multi-layer lead frame adapted to be used for a semiconductor device comprising:
   a metal core plate on which a semiconductor chip is to be mounted;
   a plurality of signal lines formed on said metal core plate;
   a metal plane, such as a power supply plane or a ground plane, being substantially frame shaped and having a central opening and a length and width smaller than that of said metal core plate;
   an insulating layer;
   said metal plane laminated on said signal lines through said insulating layer, so that at least an outer peripheral edge of said metal core plate is uncovered to expose at least a portion of a respective one of said plurality of signal lines;
   a lead frame body;,
   a plurality of leads, on said lead frame body, which are electrically connected to said signal lines at said outer peripheral edge of said metal core plate;
   a frame member integrally supporting said plurality of leads of the lead frame body; and
   said metal plane being integrally formed with said lead frame body, in such a manner that at least one of said leads integrally extends from said frame member to an outer edge of said metal plane.

2. A multi-layer lead frame as set forth in claim 1, wherein said metal core plate has a central die-bonding area on which said semiconductor chip is to be mounted, a wire bonding area around said die-bonding area and said outer peripheral edge, and each of said signal lines extends from said outer peripheral edge to said wire-bonding area.

3. A multi-layer lead frame as set forth in claim 2, wherein said central die-bonding area and said wire bonding area are located within said central opening of said metal plane.

4. A metal-core-type multi-layer lead frame adapted to be used for a semiconductor device comprising:
   a metal core plate on which a semiconductor chip is to be mounted;
   a plurality of signal lines formed on said metal core plate;
   a metal plane, such as one of a power supply plane and a ground plane, laminated on said signal lines through an insulating layer, so that at least an outer peripheral edge of said metal core plate is uncovered to expose at least a portion of said respective signal lines;
   a lead frame body having a plurality of leads which are electrically connected to said signal lines at said outer peripheral edge of said metal core plate;
   said plurality of leads of the lead frame body being integrally supported by a frame member;
   said metal plane being formed integrally with said lead frame body, in such a manner that at least one of said leads integrally extends from said frame member to said metal plane;
   first connecting means for electrically connecting at least one of said leads to said metal core plate via at least one of said signal lines; and
   second connecting means for electrically connecting said metal core plate to another of said signal lines so that said metal plate can be used as the other of the power supply plane and the ground plane.

5. A metal-core-type multi-layer lead frame as set forth in claim 4, wherein said first and second connecting means comprise through holes which are plated with a conductive material, such as copper.

6. A metal-core-type multi-layer lead frame adapted to be used for a semiconductor device comprising:
   a metal core plate having a central die-bonding area on which a semiconductor chip is to be mounted, a wire bonding area around said die-bonding area and an outer peripheral edge;
   a plurality of signal lines formed on said metal core plate, each of said signal lines extending from said outer peripheral edge to said wire-bonding area on said metal core plate;
   a first metal plane, such as a power supply plane, laminated on said signal lines through a first insulating layer, so that at least said die-bonding area, said wire bonding area and said outer peripheral edge of said metal core plate are uncovered by said first metal plane to expose outer and inner portions of said respective signal lines;
   a second metal plane, such as a ground plane, laminated on said first metal plane through a second insulation layer, so that at least an inner peripheral edge of said first metal plane is uncovered by said second metal plane to expose at least an inner periphery of said first metal plane; and
   a lead frame body having a plurality of leads which are electrically connected to said signal lines at said outer peripheral edge of said metal core plate.

7. A multi-layer lead frame as set forth in claim 6, wherein said first metal plane has a central opening, so that said central die-bonding area and said wire bonding area are located within said central opening of said first metal plane.

8. A multi-layer lead frame as set forth in claim 7, wherein said second metal plane has a central opening, so that said inner peripheral edge of said first metal plane is located within said central opening of said second metal plane.

9. A multi-layer lead frame as set forth in claim 6, wherein said plurality of leads of the lead frame body are integrally supported by a frame member.

10. A multi-layer lead frame as set forth in claim 6, wherein said first metal plane is formed integrally with said lead frame body, in such a manner that at least one of said leads integrally extends from said frame member to said first metal plane.

11. A multi-layer lead frame as set forth in claim 6, wherein said second metal plane is electrically connected to at least one of said leads of said lead frame body.

12. A multi-layer lead frame as set forth in claim 4, wherein said metal core plate has a central die-bonding area on which a semiconductor chip is to be mounted;
   a wire bonding area around said die-bonding area and said outer peripheral edge; and
   each of said signal lines extending from said outer peripheral edge to said wire-bonding area.

13. A multi-layer lead frame as set forth in claim 12, wherein said metal plane has a central opening, so that said central die-bonding area and said wire bonding area are located within said central opening of said metal plane.

* * * * *

UNITED STATES PATENT AND TRADEMARK OFFICE
CERTIFICATE OF CORRECTION

PATENT NO. : 5,389,816

DATED : February 14, 1995

INVENTOR(S) : SHIMIZU et al.

It is certified that error appears in the above-indentified patent and that said Letters Patent is hereby corrected as shown below:

Col. 3, line 25, delete "10", and begin a new paragraph with "A".

Col. 5, line 27, delete ",";
line 65, delete "plane" and insert therefor --plate--.

Signed and Sealed this

Sixth Day of June, 1995

Attest:

BRUCE LEHMAN

*Attesting Officer*  *Commissioner of Patents and Trademarks*